US012622044B2

(12) United States Patent
Wang et al.

(10) Patent No.: US 12,622,044 B2
(45) Date of Patent: May 5, 2026

(54) METHOD OF MAKING BREAKDOWN RESISTANT SEMICONDUCTOR DEVICE

(71) Applicant: TAIWAN SEMICONDUCTOR MANUFACTURING COMPANY, LTD., Hsinchu (TW)

(72) Inventors: Jhong-Sheng Wang, Taichung (TW); Ting-Sheng Huang, Hsinchu (TW); Jiaw-Ren Shih, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 170 days.

(21) Appl. No.: 16/780,570

(22) Filed: Feb. 3, 2020

(65) Prior Publication Data
US 2020/0176327 A1      Jun. 4, 2020

Related U.S. Application Data

(62) Division of application No. 15/583,126, filed on May 1, 2017, now Pat. No. 10,553,494.
(Continued)

(51) Int. Cl.
*H01L 21/336*      (2006.01)
*H10D 30/62*      (2025.01)
(Continued)

(52) U.S. Cl.
CPC ........... *H10D 84/038* (2025.01); *H10D 30/62* (2025.01); *H10D 30/6713* (2025.01);
(Continued)

(58) Field of Classification Search
CPC ........... H01L 29/78687; H01L 29/0669; H01L 29/068; H01L 29/0665; H01L 29/7855;
(Continued)

(56) References Cited

U.S. PATENT DOCUMENTS 4,984,043 A * 1/1991 Vinal .................. H01L 29/4916
257/E29.264
5,045,706 A * 9/1991 Tanaka .................. G01T 1/2004
250/483.1
(Continued)

FOREIGN PATENT DOCUMENTS

WO      WO-2004097942 A1 * 11/2004 ....... H01L 21/26506

OTHER PUBLICATIONS

Office Action dated Jul. 31, 2020 from corresponding application No. TW 106119594.

*Primary Examiner* — Ajay Ojha
*Assistant Examiner* — Tsz K Chiu
(74) *Attorney, Agent, or Firm* — Hauptman Ham, LLP

(57) ABSTRACT

A method of manufacturing a semiconductor device includes implanting a channel region of a first transistor and a channel region of a second transistor to have a first conductivity type. The method further includes forming source/drain regions of the first transistor to have the first conductivity type and source/drain regions of the second transistor to have a second conductivity type, wherein the second conductivity is different from the first conductivity type. The method further includes depositing a first work function layer over the channel region of the first transistor. The method further includes depositing a second work function layer over the channel region of the second transistor, wherein the first work function layer includes a same material as the second work function layer.

20 Claims, 12 Drawing Sheets

Related U.S. Application Data

(60) Provisional application No. 62/427,548, filed on Nov. 29, 2016.

(51) Int. Cl.

| | |
|---|---|
| *H10D 30/67* | (2025.01) |
| *H10D 62/10* | (2025.01) |
| *H10D 62/13* | (2025.01) |
| *H10D 62/17* | (2025.01) |
| *H10D 84/01* | (2025.01) |
| *H10D 84/03* | (2025.01) |
| *H10D 84/85* | (2025.01) |
| *H10D 86/00* | (2025.01) |

(52) U.S. Cl.
CPC ..... *H10D 30/6715* (2025.01); *H10D 30/6735* (2025.01); *H10D 30/6739* (2025.01); *H10D 30/6757* (2025.01); *H10D 62/121* (2025.01); *H10D 62/151* (2025.01); *H10D 62/235* (2025.01); *H10D 84/0167* (2025.01); *H10D 84/0177* (2025.01); *H10D 84/85* (2025.01); *H10D 84/853* (2025.01); *H10D 86/201* (2025.01); *H10D 30/6218* (2025.01); *H10D 84/017* (2025.01)

(58) Field of Classification Search
CPC ........... H01L 29/7858; H01L 29/78696; H01L 29/785; H01L 29/78618; H01L 23/5286; H01L 21/02532; H01L 23/5283; H01L 23/485; H01L 21/76897; H01L 21/76895; H01L 21/02603; H01L 23/5226; H01L 23/481; H01L 23/535; H01L 21/02636; H01L 21/76224; H01L 21/28518; H01L 21/0259; H01L 21/30604; H01L 21/76898; H01L 23/528; H01L 21/02579; H01L 21/02592; H01L 21/02598; H01L 21/76805; H01L 21/28088; H01L 21/3065; H01L 21/02576; H01L 21/0262; H01L 21/31053; H01L 21/762; H01L 21/76816; H01L 21/76831; H01L 23/5386; H01L 21/02123; H01L 21/02236; H01L 21/26513; H01L 21/2652; H01L 21/266; H01L 21/28185; H01L 21/308; H01L 21/31116; H01L 21/324; H01L 21/3247; H01L 21/76229; H01L 21/768; H01L 21/76814; H01L 21/76877; H01L 23/522; H01L 23/5225; H01L 21/02027; H01L 21/02164; H01L 21/02271; H01L 21/02332; H01L 21/0234; H01L 21/02521; H01L 21/02529; H01L 21/02573; H01L 21/02667; H01L 21/26506; H01L 21/28044; H01L 21/28052; H01L 21/30608; H01L 21/31138; H01L 21/31144; H01L 21/426; H01L 21/441; H01L 21/461; H01L 21/477; H01L 21/76837; H01L 21/76846; H01L 21/76847; H01L 21/76856; H01L 21/76883; H01L 22/12; H01L 2224/16146; H01L 2225/06517; H01L 2225/06524; H01L 23/53266; H01L 25/0657; H01L 21/02057; H01L 21/02063; H01L 21/02172; H01L 21/02233; H01L 21/02247; H01L 21/02255; H01L 21/0276; H01L 21/187; H01L 21/2253; H01L 21/2255; H01L 21/26586; H01L 21/28026; H01L 21/28114; H01L 21/28202; H01L 21/28525; H01L 21/28556; H01L 21/28568; H01L 21/302; H01L 21/3086; H01L 21/31111; H01L 21/31122; H01L 21/31155; H01L 21/32051; H01L 21/3213; H01L 21/32136; H01L 21/32139; H01L 21/47573; H01L 21/74; H01L 21/76801; H01L 21/76802; H01L 21/76819; H01L 21/76825; H01L 21/76826; H01L 21/76834; H01L 21/7684; H01L 21/76841; H01L 21/76843; H01L 21/76886; H01L 23/147; H01L 23/3128; H01L 23/367; H01L 23/3738; H01L 23/49811; H01L 23/49838; H01L 23/50; H01L 23/53204; H01L 23/53271; H01L 23/5329; H01L 2924/01013; H01L 2924/01022

See application file for complete search history.

(56) References Cited

U.S. PATENT DOCUMENTS

| | | | | |
|---|---|---|---|---|
| 5,196,908 | A * | 3/1993 | Kusunoki | H01L 29/10 257/E29.043 |
| 5,460,998 | A | 10/1995 | Liu | |
| 5,612,243 | A * | 3/1997 | Verrett | H01L 21/76889 438/233 |
| 5,767,557 | A * | 6/1998 | Kizilyalli | H01L 21/2652 257/E21.337 |
| 5,814,869 | A | 9/1998 | Dennen | |
| 6,144,079 | A * | 11/2000 | Shirahata | H01L 21/74 257/E21.336 |
| 6,297,100 | B1 | 10/2001 | Kumar | |
| 6,331,458 | B1 * | 12/2001 | Anjum | H01L 29/0847 438/307 |
| 6,492,220 | B2 * | 12/2002 | Ikeda | H10D 84/0167 438/433 |
| 6,548,363 | B1 | 4/2003 | Wu et al. | |
| 6,680,226 | B2 * | 1/2004 | Efland | H01L 21/823412 257/E27.06 |
| 6,703,673 | B2 | 3/2004 | Houston | |
| 6,713,779 | B2 | 3/2004 | Tezuka | |
| 7,176,530 | B1 | 2/2007 | Bulucea | |
| 7,804,152 | B2 * | 9/2010 | Yeh | G11C 16/10 257/506 |
| 8,377,787 | B2 | 2/2013 | Chu et al. | |
| 8,569,834 | B2 | 10/2013 | Fonash | |
| 8,896,055 | B2 | 11/2014 | Yeh et al. | |
| 9,735,269 | B1 * | 8/2017 | Cheng | H01L 29/0665 |
| 9,837,416 | B2 * | 12/2017 | Walke | H01L 29/1054 |
| 10,020,051 | B1 * | 7/2018 | Leobandung | H01L 21/823475 |
| 10,325,993 | B2 * | 6/2019 | Wang | H01L 29/42392 |
| 2002/0006693 | A1 * | 1/2002 | Matsuda | H01L 29/105 257/E21.337 |
| 2002/0047143 | A1 * | 4/2002 | Ramdani | H01L 21/8252 257/E27.012 |
| 2002/0074937 | A1 * | 6/2002 | Guberman | H01L 51/5287 313/511 |
| 2002/0180069 | A1 | 12/2002 | Houston | |
| 2003/0008462 | A1 * | 1/2003 | Horiuchi | H01L 29/105 257/E29.055 |
| 2003/0020136 | A1 * | 1/2003 | Kitabatake | H01L 29/7391 257/E29.198 |
| 2004/0061188 | A1 * | 4/2004 | Demkov | H01L 29/513 257/411 |
| 2004/0188767 | A1 * | 9/2004 | Weber | H01L 21/26513 257/E21.345 |
| 2004/0222457 | A1 * | 11/2004 | Kim | H01L 29/7834 257/328 |
| 2004/0227186 | A1 * | 11/2004 | Saito | H01L 27/1203 257/E21.703 |
| 2005/0079659 | A1 * | 4/2005 | Duan | H01L 29/7869 438/197 |

(56) References Cited

U.S. PATENT DOCUMENTS

| | | | | |
|---|---|---|---|---|
| 2006/0170053 | A1* | 8/2006 | Yeo | H01L 29/66795 |
| | | | | 257/353 |
| 2009/0072344 | A1* | 3/2009 | Im | H01L 21/823481 |
| | | | | 257/E27.001 |
| 2010/0140589 | A1* | 6/2010 | Ionescu | H01L 29/7391 |
| | | | | 257/24 |
| 2010/0193883 | A1* | 8/2010 | Hase | H01L 29/518 |
| | | | | 257/411 |
| 2010/0216288 | A1* | 8/2010 | Chiu | H01L 21/823814 |
| | | | | 438/231 |
| 2010/0276662 | A1* | 11/2010 | Colinge | H01L 29/0665 |
| | | | | 257/E21.409 |
| 2011/0042725 | A1* | 2/2011 | Ohmi | H01L 29/045 |
| | | | | 257/487 |
| 2011/0254013 | A1* | 10/2011 | Xiao | H01L 21/84 |
| | | | | 257/369 |
| 2011/0254058 | A1* | 10/2011 | Xiao | H01L 21/845 |
| | | | | 257/369 |
| 2012/0025327 | A1* | 2/2012 | Ji | H01L 21/283 |
| | | | | 257/411 |
| 2012/0139062 | A1* | 6/2012 | Yuan | H01L 21/823462 |
| | | | | 257/411 |
| 2012/0223390 | A1* | 9/2012 | Liang | H01L 29/4908 |
| | | | | 257/E21.409 |
| 2012/0261761 | A1* | 10/2012 | Wang | H01L 29/66545 |
| | | | | 257/368 |
| 2013/0154019 | A1* | 6/2013 | Ando | H01L 21/28079 |
| | | | | 257/369 |
| 2013/0270619 | A1* | 10/2013 | Schloesser | H01L 29/40111 |
| | | | | 257/295 |
| 2014/0110778 | A1* | 4/2014 | Fumitake | H01L 21/823842 |
| | | | | 257/330 |
| 2015/0340490 | A1* | 11/2015 | An | H01L 29/78618 |
| | | | | 257/401 |
| 2017/0250291 | A1* | 8/2017 | Lee | H01L 29/42392 |
| 2017/0358658 | A1* | 12/2017 | Rios | H01L 29/0673 |
| 2018/0026639 | A1* | 1/2018 | Aurola | H01L 29/78 |
| | | | | 326/81 |
| 2018/0090569 | A1* | 3/2018 | Yang | H01L 27/0207 |
| 2018/0190804 | A1* | 7/2018 | Chui | H01L 29/73 |
| 2018/0286950 | A1* | 10/2018 | Fujii | H01L 29/66575 |
| 2019/0164847 | A1* | 5/2019 | Maekawa | H01L 21/823864 |
| 2020/0328309 | A1* | 10/2020 | Yin | H01L 21/823821 |
| 2021/0098049 | A1* | 4/2021 | Yang | G11C 5/063 |

* cited by examiner

402

500

| Dope a channel of a FET | 504 |

| Deposit a gate dielectric layer on a substrate | 506 |

| Dope a source and a drain of the FET | 508 |

| Deposit a work function layer | 510 |

| Deposit a gate electrode material | 512 |

700

708

706

408

704

702

404     708     406

700

706     408

704

702

METHOD OF MAKING BREAKDOWN RESISTANT SEMICONDUCTOR DEVICE

PRIORITY CLAIM

The instant application is a divisional of U.S. application Ser. No. 15/583,126, filed May 1, 2017, now U.S. Pat. No. 10,553,494, issued Feb. 4, 2020, which claims priority to a non-provisional application claiming priority to Provisional Application No. 62/427,548, filed Nov. 29, 2016, the entire contents of which are incorporated by reference herein.

BACKGROUND

Semiconductor devices having smaller channel lengths experience heightened levels of device failures associated with hot carrier injection (HCI), time-dependent dielectric breakdown (TDDB), and bias threshold instability (BTI) in comparison with semiconductor devices having longer channel lengths. As technology nodes for semiconductor devices decrease, thinner gate dielectric layers are used to reduce short channel effects. Gate-induced dielectric loss (GIDL) is more prevalent with semiconductor devices having thin gate dielectric layers adjoining field effect transistors (FETs) than with other semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION

Figure 1:
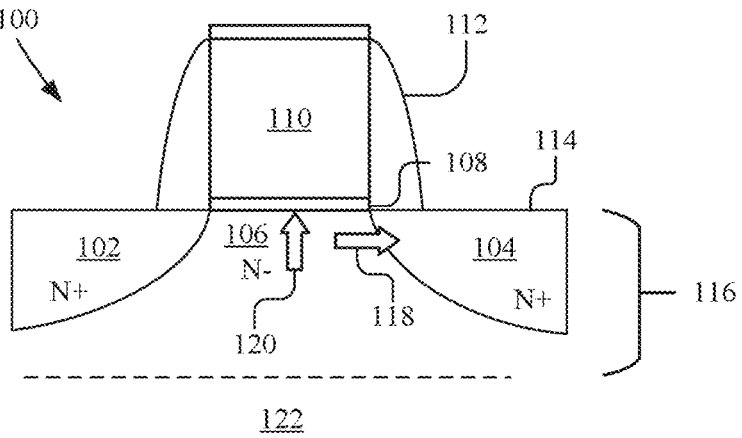
FIG. 1 is a cross-sectional view of an N-type accumulation mode field effect transistor (FET), according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aging-related breakdown of semiconductor devices includes breakdown mechanisms such as hot carrier injection (HCI), time-dependent dielectric breakdown (TDDB), and bias temperature instability. Rates of aging-related FET breakdown increase in conjunction with cumulative exposure of transistors to elevated temperatures and cumulative flow of electrical current. Aging-related transistor breakdown by HCI, TDDB, and BTI is enhanced with increased current density at the interface of a channel and a gate dielectric material in a transistor. One factor in decreasing rates of aging-related FET breakdown is reducing electrical fields in the region of the gate dielectric material in the FETs. Another factor in decreasing rates of aging-related FET breakdown is conducting less current at the interface of the gate dielectric layer and the channel.

In comparison with other planar metal-oxide-semiconductor field effect transistors (MOSFETs), which channel includes an opposite dopant from source and drain regions and carriers are induced under an inversion mode, accumulation mode MOSFETs experience smaller fields between the gate dielectric layer and the channel region. One factor in the strong field strength is the geometry of the interface between the gate dielectric layer and the channel region. Planar MOSFETs have a single, flat interface between the gate dielectric layer and the channel region, drawing the charge carriers in a single direction during operation of the planar MOSFET. FinFET devices and nanowire FETs (NWFETs) are constructed with three-dimensional, rather than two-dimensional, channels. Because the gate electrode and the gate dielectric layer surround the channel of FinFETs on three sides, and surround the channel of NWFETs on four sides, the electrical field that triggers current flow through the channel does not pull all the charge carriers to a single side of the device. Instead, the electrical field in FinFETs and NWFETs pulls charge carriers to multiple sides of the channel, reducing the total carrier density at the gate dielectric layer/channel interface during device operation. Consequently, aging-related breakdown of FinFETs and NWFETs occurs at lower rates than for planar MOSFETs.

Reducing the carrier density at the channel/gate dielectric layer interface is also accomplished by using accumulation mode FETs. In other approaches, FETs have a P-N junction at interfaces between the channel and the source and drains because the source and drain are doped with one type of dopant, and the channel has an opposite type of dopant. The P-N junction not only generates a constant voltage at channel interfaces, but also increases a threshold voltage for triggering current flow through the channel of the FETs. Accumulation mode FETs, by contrast, have a single dopant type present in each of the channel, the source, and the drain. The single dopant type is either an N-type dopant or a P-type dopant. With a single dopant type in the channel, the source, and the drain, there is no induced voltage at the channel-source and channel-drain interfaces. Further, the strength of the electrical field used to trigger current flow through the channel is smaller than FETs of similar dimensions and structure in other approaches. By adjusting the concentrations of the dopant in the source, the drain, and the channel to different values, and by selecting a work function layer in a gate electrode to cause a work function layer difference between the gate electrode and the channel region, a threshold voltage is determined for each FET in an integrated circuit. According to some embodiments, NFETs and PFETs are constructed to have different threshold voltages according to design characteristics of an integrated circuit.

FIG. 1 is a cross-sectional view of an N-type accumulation mode field effect transistor (FET) 100, according to some embodiments. A source 102 and a drain 104 are doped with an N-type dopant at a first concentration. Channel 106 is also doped with an N-type dopant at a second concentration. The second concentration is less than the first concentration. In some embodiments of N-type accumulation mode FETs, channel dopant concentrations (the second concentration) ranges from about $5e16$ cm$^{-3}$ to about $1e18$ cm$^{-3}$, although other concentrations of dopant in the channel are compatible with the present disclosure. As the channel dopant concentration increases a number of charge carriers increases; however, a risk of leakage current increases, in some instances. In some embodiments, a concentration of dopant in source 102 or drain 104 (the first concentration) ranges from about $1e19$ cm$^{-3}$ to about $1e21$ cm$^{-3}$ in order to reduce parasitic resistance in source 102 and drain 104. A gate dielectric layer 108 is on the channel 106. A gate electrode 110 is on the gate dielectric layer 108. A pair of spacers 112 are against the sides of the gate electrode 110 and the gate dielectric layer 108 and on a top side 114 of a substrate 116 that contains the source 102, drain 104, and channel 106. In order to reduce parasitic capacitance and current between adjoining FETs, substrate 116 includes at least one well 122 having an opposite dopant type than source 102, drain 104 and channel 106. According to some embodiments, the bulk portion of substrate 116 has a lower concentration of the dopant than the first concentration and the second concentration. In some embodiments, substrate 116 is a fin material deposited onto a semiconductor wafer. In some embodiments, substrate 116 includes a fin structure resulting from patterning a semiconductor wafer. In some embodiments, substrate 116 is includes silicon germanium. In some embodiments, substrate 116 includes silicon. In some embodiments, substrate 116 includes a III-V semiconductor material. In some embodiments, substrate 116 is another semiconductor material compatible with forming transistors.

A first arrow 118 indicates a direction of an electric field between drain 104 and channel 106 during operation of N-type accumulation FET 100. A second arrow 120 indicates a direction of an electric field between channel 106 and gate electrode 110 during operation of N-type accumulation FET 100.

In N-type accumulation mode FET 100, magnitudes of the electrical fields indicated by first arrow 118 and second arrow 120 are smaller than for N-type FETs (NFETs) having opposite-type dopants in channel 106 and in source 102/ drain 104. In NFETS of other approaches, for example, in an enhancement mode, P-N junctions at the interfaces between the channel and the source, and between the channel and the drain, have induced voltages as the carriers in each region are drawn to the interface between these regions. This induced voltage in a FET elevates the threshold voltage that activates operation of the FET as compared to threshold voltage of accumulation mode FET 100. FETs such as N-type accumulation mode FET 100 are more resistant to aging-related breakdown due to HCI, TDDB, and BTI than FETs in other approaches because the vertical field strength, indicated by second arrow 120, experienced across the gate dielectric layer (between the channel and the gate electrode material) reduces an impact energy of charge carriers against the gate dielectric layer. As a result, a risk of the carriers becoming embedded in the gate dielectric layer is reduced; and a depth of carrier embedded in the gate dielectric layer is smaller in comparison with a FET in other approaches. Smaller vertical field strength reduces the risk of damage to the gate dielectric layer interface with the channel, and the resulting reduced impact of carriers that leads to aging-related breakdown of FETs.

Figure 2:
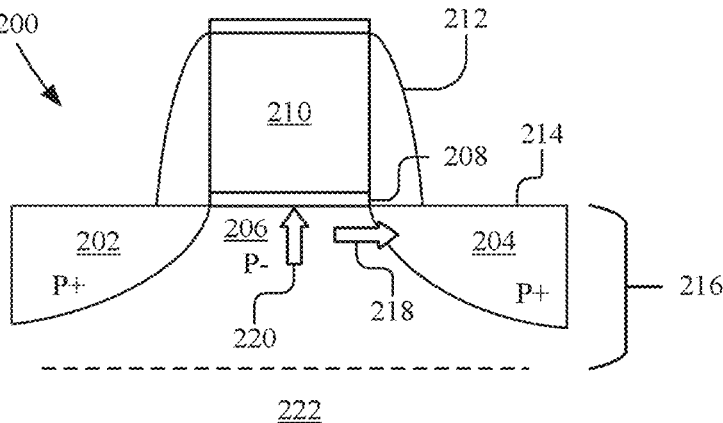
FIG. 2 is a cross-sectional view of a P-type accumulation mode FET, according to some embodiments.

FIG. 2 is a cross-sectional view of a P-type accumulation mode FET 200, according to some embodiments. Elements in P-type accumulation mode FET 200 which are similar to elements in N-type accumulation mode FET 100 have a same reference number increased by 100. In comparison with N-type accumulation mode FET 100, P-type accumulation mode FET 200 includes P-type dopants in source 202, drain 204 and channel 206. In some embodiments of P-type accumulation mode FETs, a channel dopant concentration is between from about $5e16$ cm$^{-3}$ to about $1e18$ cm$^{-3}$, although other concentrations are also compatible with the embodiments disclosed herein. Dopant concentrations larger than $1e18$ cm$^{-3}$ reduce carrier scattering and to improve on-state current in channel 206. According to some embodiments, the second concentration is less than the first concentration. In some embodiments, a concentration of dopant in source 202 or drain 204 is between from about $1e19$ cm$^{-3}$ to about $1e21$ cm$^{-3}$. In some embodiments, the dopant concentration in source 202 and drain 204 is ten times greater than dopant concentration in channel 206 to reduce parasitic resistance in source 202 and drain 204.

TABLE 1

| | Device | NMOS | PMOS |
|---|---|---|---|
| Mode FETs in other approaches | Gate work function | Small | Large |
| | Channel Implantation | P-type | N-type |
| | Vertical Field Strength | Large | Large |
| | Lateral Field Strength | Large | Large |
| Breakdown Resistant FETs | Gate work function | Large | Small |
| | Channel Implantation | N-type | P-type |
| | Vertical Field Strength | Small | Small |
| | Lateral Field Strength | Small | Small |

Table 1 above includes a summation of features of NFETs and PFETs in other approaches and features of accumulation mode FETs such as N-type accumulation mode FET 100 (FIG. 1) and P-type accumulation mode FET 200 (FIG. 2). In particular, Table 1 clarifies that the vertical and lateral field strength in NFETS and PFETs in other approaches is larger than the vertical and lateral field strength in breakdown resistant FETs. For a breakdown resistant FET, when a voltage applied on the gate electrode, $V_g$, is 0 V, the dielectric E-field is ranges from about 0.13 MV/cm to about 0.14 MV/cm, and when $V_g$ is set to a first reference voltage, e.g., $V_{cc}$ (the positive supply of an integrated circuit), the dielectric E-field ranges from about 4.15 MV/cm to about 4.4 MV/cm, in some instances. However, the dielectric E-field of the breakdown resistant FET is less than that of the FET in other approaches. According to some embodiments, the dielectric E-field of a breakdown resistant FET (when $V_g=V_{cc}$) ranges from 80% of the dielectric E-field of a conventional design FET up to 90% of the dielectric E-field of a conventional design FET. The reduced dielectric E-field helps breakdown resistant FETs, such as N-type accumulation mode FET 100 or P-type accumulation mode FET 200, are resistant to aging-related breakdown due to HCI, TDDB, and BTI because the vertical field strength experienced across the gate dielectric layer (between the channel and the gate electrode material) reduces the impact of charge carriers against the gate dielectric layer, as compared to FETs in other approaches of similar dimensions. Smaller vertical field strength reduces damage to the gate dielectric layer interface with the channel, offsetting the onset of reduced carrier mobility that leads eventually to aging-related breakdown of FETs. While $V_g$ applied to induce carriers in the channel region, e.g., electrons in channel 206, is reduced due to the accumulation mode operation, a threshold voltage $V_t$ is adjustable by other approaches. In some embodiments, the threshold voltage $V_t$ is adjusted by modifying a work function difference between the gate electrode and the substrate. In at least one embodiment, the threshold voltage $V_t$ under the accumulation mode operation is substantially the same as the threshold voltage $V_t$ under the inversion mode operation by modifying the work function layer in the gate electrode and channel implantation in the channel region. As a result, in comparison to FETs in other approaches, accumulation mode FETs have smaller field strengths while maintaining a same threshold voltage $V_t$. Based on various circuit design requirements, a combination of accumulation mode FETs and FETs in other approaches helps to improve a product reliability.

Figure 3A:
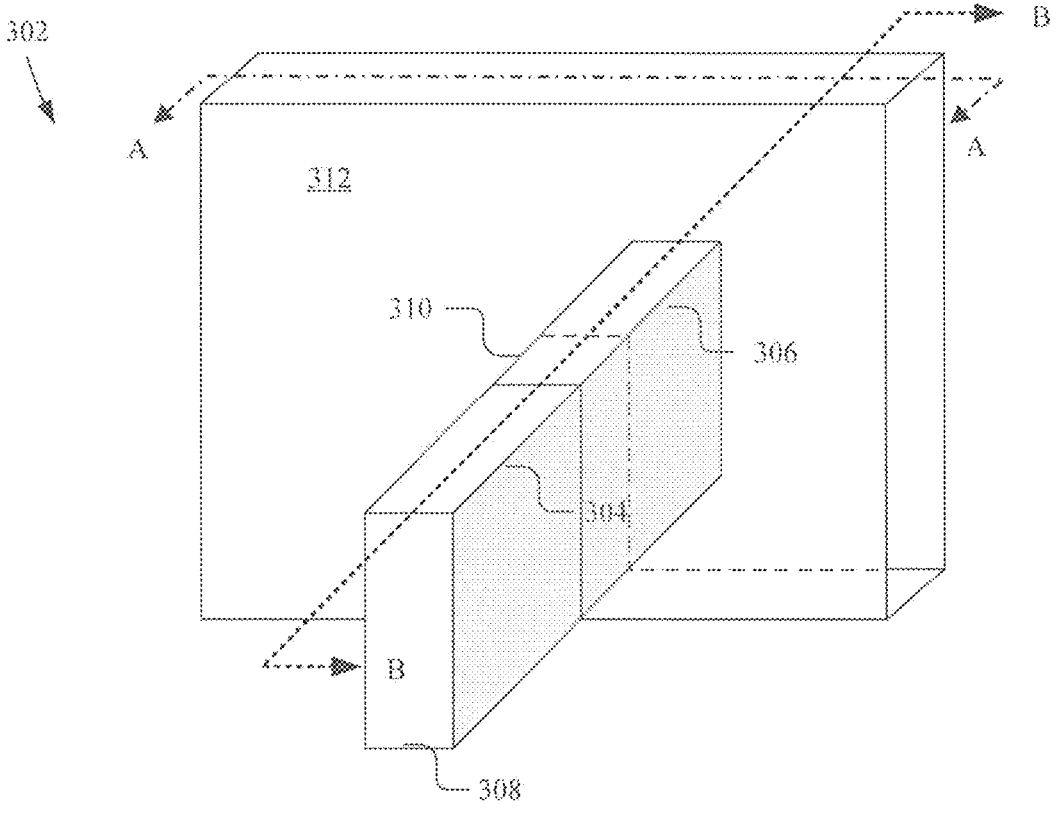
FIG. 3A is a perspective view of a fin field effect transistor (FinFET), according to some embodiments.

FIG. 3A is a perspective view of an accumulation mode fin field effect transistor (FinFET) 302, according to some embodiments. FinFET 302 has a source 304 and a drain 306 in fin 308. Fin 308 also contains channel 310 between source 304 and drain 306 and beneath gate electrode 312. Cross-sectional line A-A extends in the direction of gate electrode 312 along a length of gate electrode 312. Cross-sectional line B-B extends perpendicular to cross-sectional line A-A and through fin 308 of FinFET 302. According to some embodiments, FinFET 302 is an accumulation mode FinFET where source 304, drain 306, and channel 310 all have a common conductivity type of dopant. In some embodiments, source 304 has a first concentration of the first dopant, drain 306 has a second concentration of the first dopant, and channel 310 has a third concentration of the first dopant. In some embodiments, source 304 and drain 306 have a first dopant of the first type, and channel 310 has a second dopant (different from first dopant) also of the first type. In some embodiments, source 304 and drain 306 have a plurality of dopants of a first type, and channel 310 has a single dopant of the plurality of dopants of the first type in source 304 and drain 306. In some embodiments, source 304 and drain 306 have a plurality of dopants of a first type, and channel 310 has a single dopant of the first type different from the dopants of the plurality of dopants of the first type in source 304 and drain 306.

According to some embodiments, the third concentration is smaller than the first and second concentrations. In some embodiments, the first and second concentrations are different from each other. In some embodiments, the first concentration is equal to the second concentration. Dopant concentrations in some embodiments of FinFETs are approximately the same as those described above for planar N-type accumulation mode FET 100 (see FIG. 1) and P-type accumulation mode FET 200 (see FIG. 2). In some embodiments, source 304, drain 306, and channel 310 are doped with multiple dopants having a same dopant type (N-type or P-type).

According to various embodiments, an accumulation mode FinFET has at least one fin in the FinFET. A number of fins in an accumulation mode FinFET is determined according to a circuit layout of a semiconductor device and according to other characteristics of a circuit, such as channel length or fin pitch. According to some embodiments, the common type of dopant in the source, drain, and channel of an accumulation mode FET is an N-type dopant, such as phosphorous, arsenic or another suitable N-type dopant. In some embodiments, the common type of dopant in the source, drain, and channel of an accumulation mode FET is a P-type dopant, such as boron. According to some embodiments, channel 310 has a smaller concentration of the common conductivity type dopant than source 304 or drain 306. In some embodiments, a concentration of dopant in source 304 or drain 306 is between 1.5 and 10 times greater than the dopant concentration in channel 310. In some embodiments, a dopant concentration of source 304 is the same as a dopant concentration of drain 306. In some embodiments, the dopant concentration of source 304 is different from the dopant concentration of drain 306. In some embodiment, a junction between channel 310 and source 304/drain 306 is under gate electrode 312. In some embodiments, FinFET 302 is free of a lightly-doped drain (LDD) region. In some embodiments, a junction between channel 310 and source 304/drain 306 is under gate electrode 312.

Figure 3B:
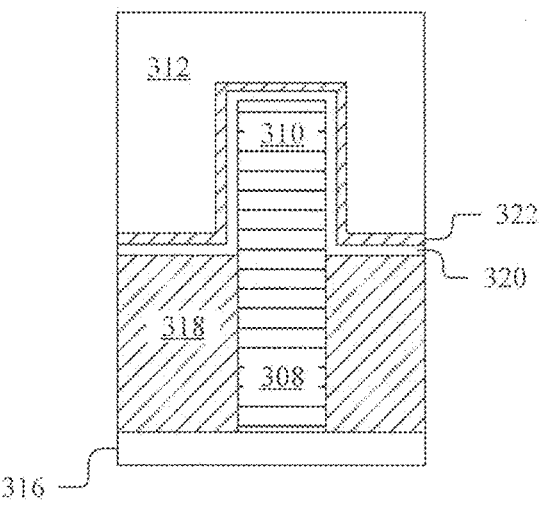
FIGS. 3B-3C are cross-sectional views of a FinFET along corresponding cross-sectional lines A-A and B-B as shown in FIG. 3A, according to some embodiments.

Similar to N-type accumulation mode FET 100 (see FIG. 1) and P-type accumulation mode FET 200 (see FIG. 2), accumulation mode FinFETs experience smaller field strength from a center of channel 310 in fin 308 toward gate electrode 312 through a gate dielectric layer 320 (see FIG. 3B). Reduced field strength between the center of channel 310 in fin 308 toward gate electrode 312 reduces the carrier density running through a region of channel 310 against the interface of channel 310 and gate dielectric layer 320. Reduced carrier density at the interface of channel 310 and gate dielectric layer 320 reduces aging of the gate dielectric layer 320 and prolongs the useful lifetime of accumulation mode FinFET 302 in comparison with a FinFET inducing carriers under an inversion mode.

FIG. 3B is a cross-sectional view of a FinFET channel along cross-sectional line A-A as described in FIG. 3A, according to some embodiments. FinFET 302 is on a substrate 316, with fin 308 extending upward from the substrate through layers of dielectric material 318. An upper portion of fin 308 forms channel 310 of FinFET 302. Gate dielectric layer 320 extends along a top side of dielectric material 318. Gate dielectric layer 320 also covers an upper portion of fin 308 where the fin protrudes through dielectric material 318. Gate dielectric layer 320 also covers a top side of fin 308 in FinFET 302. In some embodiments, work function layer 322 is situated between gate dielectric layer 320 and gate electrode material 312. In some embodiments, work function layer 322 is determined by a work function difference between work function layer 322 and a dopant concentration of channel 310.

According to some embodiments, dielectric material 318 is silicon dioxide ($SiO_2$), silicon oxy-nitride (SiON), a low-k dielectric material or another dielectric material configured to electrically insulate the fins from each other, and to electrically insulate FinFET 302 from nearby circuit elements. In some embodiments, a low-k dielectric material has a dielectric constant less than the dielectric constant of silicon dioxide. Some low-k dielectric materials contain voids or bubbles. Some low-k dielectric materials contain carbon. According to some embodiments, gate dielectric layer 320 is silicon dioxide, silicon oxynitride, or another dielectric material configured to electrically insulate the fins from the gate electrode 312. In some embodiments where gate dielectric layer 320 is silicon dioxide, gate dielectric layer 320 is formed by thermal oxidation. In some embodiments, dielectric material can be deposited by chemical vapor deposition (CVD), plasma-enhanced chemical vapor deposition (PE-CVD), or some other method of depositing materials onto a substrate.

According to some embodiments, gate dielectric layer 320 includes silicon dioxide ($SiO_2$), silicon oxy-nitride (SiON), or some other appropriate gate dielectric material for FETs. According to some embodiments, gate dielectric layer 320 is a high-k (K-dielectric constant) dielectric material with a dielectric constant greater than that of silicon dioxide (K=3.9). According to some embodiments, gate dielectric layer 320 is a gate dielectric layer comprising $HfZrO$, $HfSiO_4$, $TiO_2$, $Ta_2O_3$, $ZrO_2$, $ZrSiO_2$, or combinations thereof, or other suitable materials. According to some embodiments, gate dielectric layer 320 is formed by deposition methods such as atomic layer deposition or epitaxial film growth in order to produce a film of uniform thickness on both the top side of dielectric material 318 and the sides and top of fin 308 in FinFET 302.

According to some embodiments, gate dielectric layer 320 is overlaid with a work function layer 322 that conformally covers the dielectric layer 320. According to some embodiments, work function layer 322 completely covers dielectric material 320. In some embodiments, work function layer 322 partially covers dielectric material 318. Inclusion of work function layer 322 is optional according to design parameters of some embodiments of the present disclosure. In a FET, a threshold voltage is adjustable by modifying a dopant concentration of channel 310 and by selecting a work function layer. A FET that includes a work function layer such as a metal, a metal nitride, or a metal silicide, has a work function that is associated with the type of material that forms the work function layer. In some embodiments where fermi pinning effect occurs, i.e., the work function changes based on different gate dielectric layer, an effective work function is calculated to meet a pre-determined work function difference between the work function layer and the substrate.

According to some embodiments where FinFET 302 is an N-type transistor, work function layer 322 includes a P-type work function metal. In some embodiments where substrate 316 is a silicon-based substrate, a conduction band energy is around 4.05 electron volts (eV) and a valence band energy is around 5.17 eV. Because a voltage applied to induce holes in an accumulation mode transistor is smaller than an inversion mode transistor, an effective work function of work function layer 322 is about +/−0.45 eV of the conduction band energy. In some embodiments, work function layer 322 includes Pt, Ir, $RuO_2$, TiN, $MoN_x$, Ni, Pd, co, TaN, Ru, Mo, W or $WN_x$, or a silicide such as $ZrSi_2$, $MoSi_2$, $TaSi_2$, or $NiSi_2$, or other work function layers, or combinations thereof. One of ordinary skill in the art would understand that the effective work function is determined based on different materials included in a substrate. In some embodiments wherein FinFET 302 is a P-type transistor, the work function layer includes an N-type work function and an effective work function of work function layer 322 is +/−0.45 eV of the valance band energy. Accordingly, in some embodiments, work function layer 322 includes Ti, Nb, Ag, Au, Al, Co, W, Ni, Ta, TaAl, TaAlC, TaAlN, TaC, TaCN, TaSiN, Mn, Zr, or other N-type work function layer, or combinations thereof. In some embodiments, FinFETs in an integrated circuit have a P-type work function layer and a second subset of FinFETs in the same integrated circuit have an N-type work function layer. By selecting work function layers 322 based on an operating voltage, in some embodiments, an accumulation mode transistor has substantially a same threshold voltage of a transistor in other approaches, such as an inversion mode transistor. In such a way, for example, an absolute value of a threshold voltage of an N-type transistor is substantially the same as an absolute value of a threshold voltage of a P-type transistor. In some embodiments, FinFETs in an integrated circuit have a P-type work function layer for both P-type/N-type FinFETs. In some embodiments, FinFETs in an integrated circuit have an N-type work function layer for both P-type/N-type FinFETs. In some embodiments, P-type work function layers are used in conjunction with high-k dielectric materials on P-type accumulation mode FinFETs. In some embodiments, N-type work function layers are used in conjunction with high-k dielectric materials on N-type accumulation mode FinFETs. In some embodiments, a work function layer associated with an N-type FET is used on a P-type accumulation mode FET. In some embodiments, a work function layer associated with a P-type FET is used on an N-type accumulation mode FET. In some embodiments, semiconductor device includes a first FET having a work function layer and a second FET having either a different type of work function layer, or no work function layer. In some embodiments, the first FET is a different type of FET (N-type or P-type) than the second FET. In some embodiments, the first FET is a same type of FET as the second FET.

According to some embodiments, gate electrode 312 overlays the channel 310 of fin 308 of the FinFET. In some embodiments, gate electrode 312 is in direct contact with work function layer 322. In some embodiments, gate electrode 312 is in direct contact with gate dielectric layer 320. According to some embodiments, gate electrode 312 is separated from source 304 and drain 306 and covers an interior portion of fin 308 above channel 310. According to some embodiments, the threshold voltage of FinFET 302 is determined by regulating a dopant concentration in channel 310 beneath gate electrode 312 and selecting work function layer 322. In some embodiments, channel 310 of an accumulation mode FinFET has a dopant concentration smaller than a dopant concentration in source 304 and drain 306.

Figure 3C:
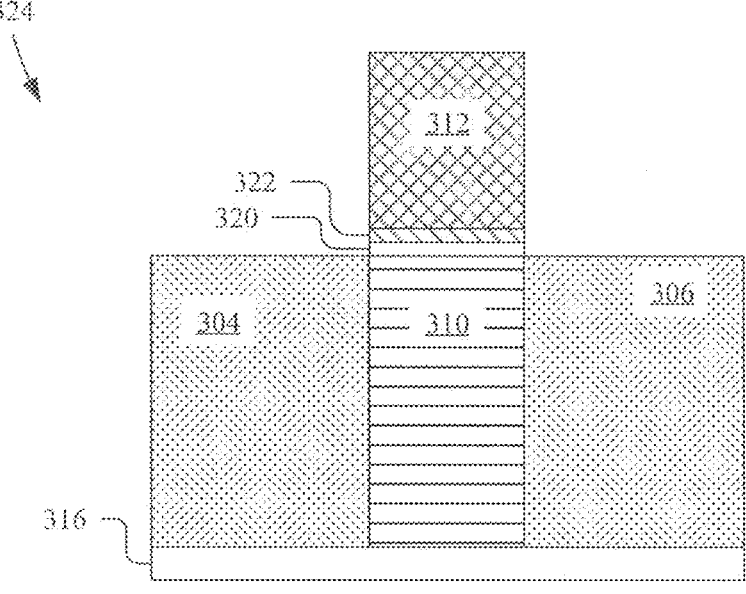

FIG. 3C is a cross-sectional view of a FinFET along cross-sectional line B-B as described in FIG. 3A, according to some embodiments. Source 304, drain 306, and fin 308 that interconnects source 304 and drain 306 are on substrate 316. Channel 310 is located at a portion of fin 308, separated from the source and drain by a section of fin 308 outside the channel 310. Gate dielectric layer 320 is located on top of channel 310 and below gate electrode 312. In some embodiments, work function layer 322 is located between gate dielectric layer 320 and gate electrode 312. According to some embodiments, gate electrode 312 has a same width as work function layer 322 and gate dielectric layer 320. In some embodiments where junctions between channel 310 and source 304/drain 306 are under gate electrode 312, gate electrode 312 has a width different from at least one of work function layer 322, gate dielectric layer 320 or channel 310. For example, a width of gate electrode 312 is greater than a length of channel 310. In some embodiments, source 304 and drain 306 are stressed source and drain regions which extend above gate dielectric layer 320.

Figure 4A:
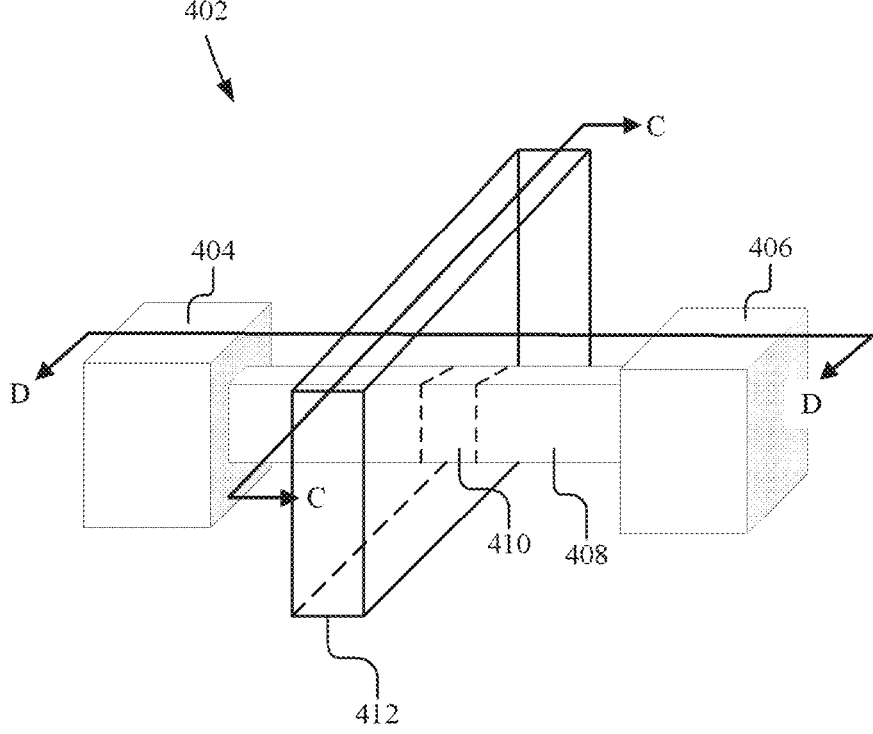
FIG. 4A is a perspective view of a nanowire field effect transistor (NWFET), according to some embodiments.

FIG. 4A is a perspective view of a nanowire field effect transistor (nanowire FET, or NWFET) 402, according to some embodiments. NWFET 402 as a source 404 and a drain 406 connected by a wire 408 that extends between source 404 and drain 406. Wire 408 is electrically isolated from a substrate (not shown) beneath source 404 and drain 406. Wire 408 has a channel 410 between source 404 and drain 406. According to some embodiments, source 404, drain 406, and wire 408 are made of a semiconductor material such as silicon, silicon germanium, or a type III-V semiconductor material. According to some embodiments, the semiconductor material used to form source 404, drain 406, and wire 408 were doped with a same dopant. NWFET 402 also has a gate electrode 412 that encompasses channel 410. Gate electrode 412 comprises a gate electrode material that, according to certain embodiments, is silicon, doped silicon, or some other material that can be fashioned into a gate electrode.

Source 404 has a first dopant at a first concentration, drain 406 has the first dopant at a second concentration, and channel 410 has the first dopant at a third concentration. In some embodiments, at least one of source 404, drain 406 or channel 410 includes more than one species dopant of a same type. According to some embodiments, the third concentration is smaller than both the first concentration and the second concentration. In some embodiments, the first concentration is approximately the same as the second concentration. According to some embodiments, the wire 408 outside of channel 410 has a fourth concentration of the first dopant that is greater than the third concentration. According to some embodiments, the fourth concentration is greater than the third concentration and smaller than the first concentration and the second concentration. In some embodiments, a species of dopant in source 404 is a same species as dopant in drain 406 and channel 410. In some embodiments, a species of dopant in source 404 is different from a species of dopant in drain 406 or channel 410. In some embodiments, a concentration of dopants in source 404 is a same concentration of dopants as in drain 406. In some embodiments, a concentration of dopants in source 404 is different from a concentration of dopants in at least one of drain 406 or channel 410. Dopant concentrations in some embodiments of NWFETs are approximately the same as those described above for planar N-type accumulation mode FET 100 (see FIG. 1) and P-type accumulation mode FET 200 (see FIG. 2).

Cross-sectional line C-C extends in the direction of gate electrode 412 and overlays channel 410 in NWFET 402. Cross-sectional line D-D extends in a direction perpendicular to cross-sectional line C-C and overlays source 404, drain 406, and wire 408. Source 404 has a first dopant at a first concentration, drain 406 has the first dopant at a second concentration, and channel 410 has the first dopant at a third concentration. The third concentration is smaller than both the first concentration and the second concentration.

As described above for N-type accumulation mode FET 100 (see FIG. 1) and P-type accumulation mode FET 200 (see FIG. 2), accumulation mode FinFETs experience smaller "vertical" field strength from a center of channel 410 in wire 408 toward gate electrode 412 through gate dielectric layer 420. Reduced vertical field strength between the interior portion of channel 410 in wire 408 and gate electrode 412 is caused by a modified work function and smaller threshold voltage for the FET. Reduced vertical field strength between the interior portion of channel 410 in wire 408 and gate electrode 412 reduces the carrier density running through a region of channel 410 against the interface of channel 410 and gate dielectric layer 420. Reduced carrier density at the interface of channel 410 and gate dielectric layer 420 reduces aging of the gate dielectric layer 420 and prolongs the lifetime of NWFET 402 before the onset of aging related breakdown caused by HCI, TDDB, and BTI.

Figure 8:
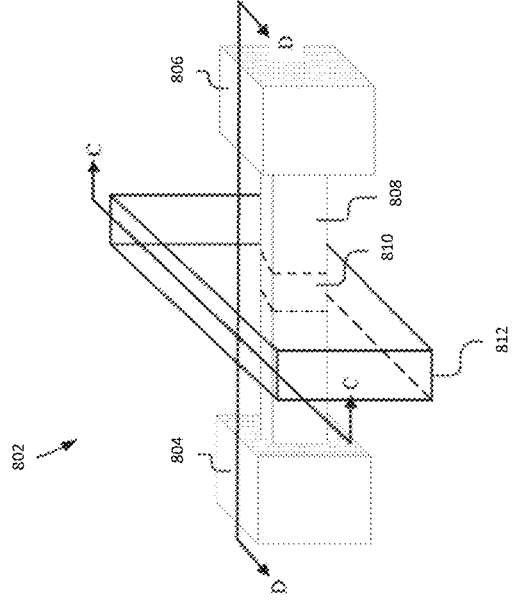
FIG. 8 is a perspective view of multiple NWFETs according to some embodiments.
Figure 8:
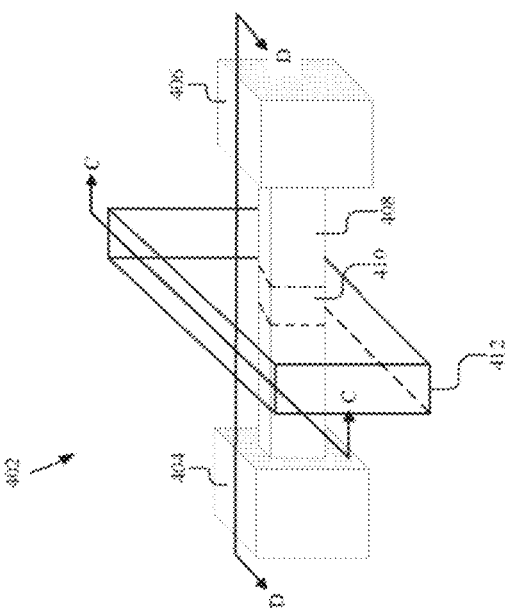

FIG. 8 is a perspective view of multiple NWFETs according to some embodiments. The NWFET 802 includes similar elements as the NWFET 402; however, a dopant type of the source and drain features of the NWFET 802 are opposite to the dopant type of the source and drain features of the NWFET 402. The NWFET 802 includes a source 804, a drain 806, a wire 808, a channel 810, and a gate electrode 812.

Figure 4B:
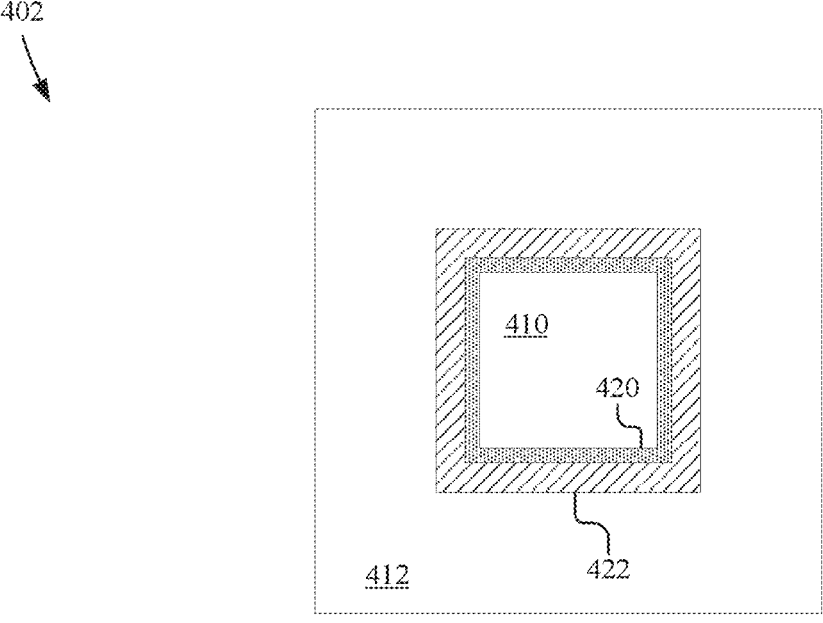
FIGS. 4B-4C are cross-sectional views of a NWFET along corresponding cross-sectional lines C-C and D-D as shown in FIG. 4A, according to some embodiments.

FIG. 4B is a cross-sectional view of NWFET 402 through channel 410 along cross-sectional line C-C as shown in FIG. 4A, according to some embodiments. Channel 410 is encompassed by gate dielectric layer 420. According to some embodiments, a work function layer 422 surrounds both gate dielectric layer 420 and channel 410, and is surrounded by gate electrode 412.

According to embodiments, channel 410 may be part of an N-doped accumulation mode FET or a P-doped accumulation mode FET. According to some embodiments, gate dielectric layer 420 includes silicon dioxide ($SiO_2$), silicon oxy-nitride (SiON), or some other dielectric material. In some embodiments, gate dielectric layer 420 is deposited by atomic layer epitaxy (ALE), atomic layer deposition (ALD), thermal oxidation, or some other method of depositing thin films on channel 410. In some embodiments, the dielectric layer 420 is a high-k dielectric material with a dielectric constant greater than that of silicon dioxide. In some embodiments, work function layer 422 is a P-type of work function metal such as Pt, Ir, $RuO_2$, TiN, $MoN_x$, Ni, Pd, co, TaN, Ru, Mo, W or $WN_x$, or a silicide such as $ZrSi_2$, $MoSi_2$, $TaSi_2$, or $NiSi_2$, or other work function layers, or combinations thereof. In some embodiments, where work function layer 422 is included, the work function and threshold voltage are configured by the type of work function layer 422 and gate dielectric layer 420 included in gate electrode 412.

In some embodiments, the work function layer is an N-type work function modifying metal such as Ti, Nb, Ag, Au, Al, Co, W, Ni, Ta, TaAl, TaAlC, TaAlN, TaC, TaCN, TaSiN, Mn, Zr, or other N-type work function layer, or combinations thereof. According to embodiments, gate electrode 412 is a semiconductor material such as silicon, silicon germanium, or other semiconductor material that can be formed into a gate electrode. Gate electrode 412 is separated from source 404 and drain 406, is located between source 404 and drain 406, covers an interior portion of wire 408, and encompasses channel 410.

In some embodiments, a work function layer associated with an N-type FET in other approaches is used on a P-type accumulation mode FET. In some embodiments, a work function layer associated with a P-type FET in other approaches is used on an N-type accumulation mode FET. In some embodiments, semiconductor device includes a first FET having a work function layer and a second FET having either a different type of work function layer, or no work function layer. In some embodiments, the first FET is a different type of FET (N-type or P-type) than the second FET. In some embodiments, the first FET is a same type of FET as the second FET.

Figure 4C:
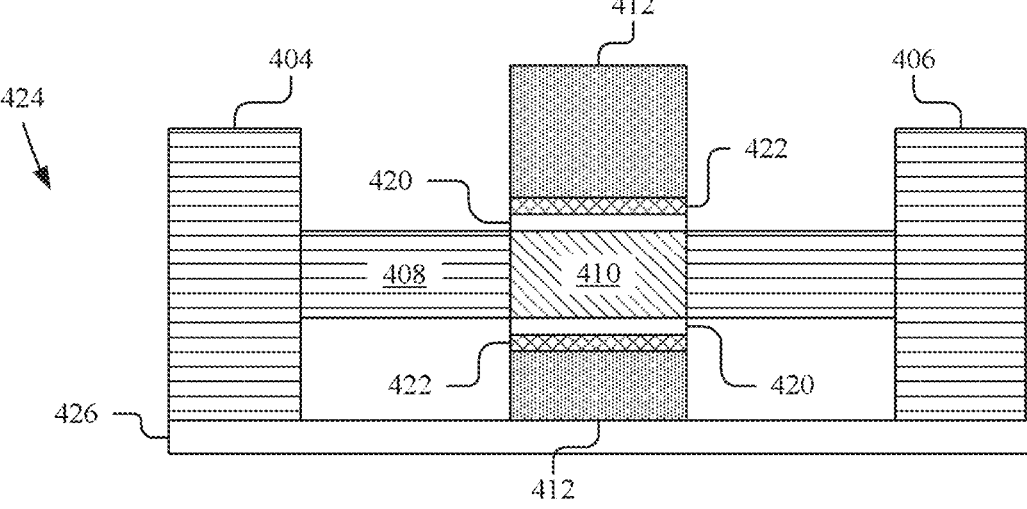

FIG. 4C is a cross-sectional view of a breakdown resistant NWFET 424 through channel 410 along cross-sectional line D-D as described in FIG. 4A, according to some embodiments. Source 404, drain 406, and gate electrode 412 rest on substrate 426. Wire 408 connects source 404 and drain 406 at points above a substrate 426. Within wire 408 has gate dielectric layer 420 on a top side and a bottom side of the channel. Gate dielectric layer 420 and channel 410 are surrounded by gate dielectric material 428 both above and below wire 408. NWFET 424 further includes a work function layer 422. Source 404 has a first concentration of a first dopant, drain 406 has a second concentration of the first dopant, and channel 410 has a third concentration of the first dopant. According to some embodiments, the third concentration is smaller than the first concentration and the second concentration. In some embodiments, source 404 and drain 406 have a single dopant. In some embodiments, each of source and drain has multiple species of dopants having a same dopant type. In some embodiments, portions of wire 408 outside of channel 410 have a concentration of the first dopant that is greater than the third concentration. In some embodiments, the concentration of the first dopant in portions of the wire outside of channel 410 is approximately the same as the first concentration and the second concentration.

Figure 5:
FIG. 5 is a flowchart of a method of forming a FET, according to some embodiments.
Figure 5:
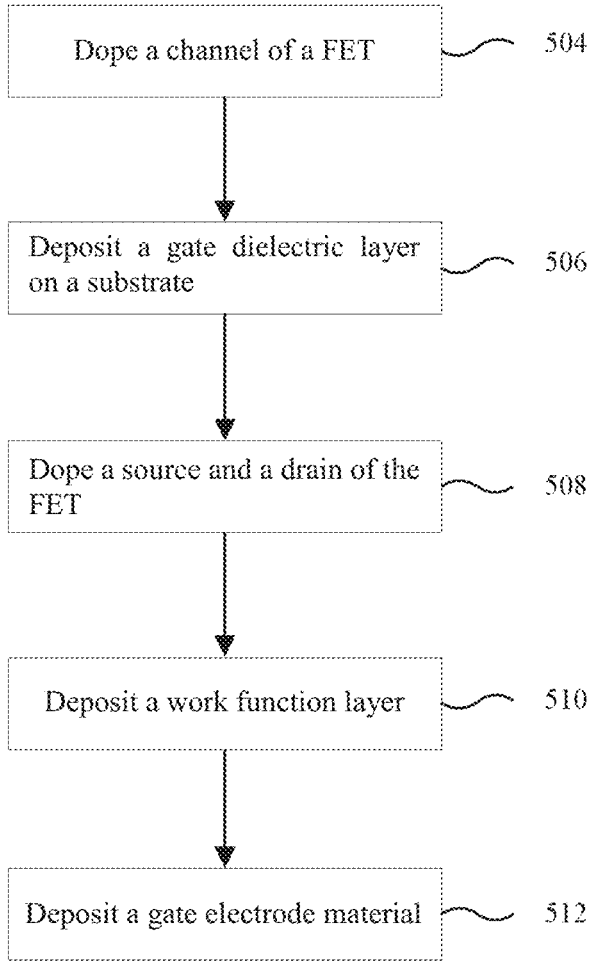

FIG. 5 is a flowchart of a method 500 of forming a FET, according to some embodiments.

In operation 504, the channel of the FET is doped with a dopant having the first dopant type. In at least one embodiment, such doping process is referred to as a threshold voltage implantation. In some embodiments, doping the channel includes an implantation process. In some embodiments, the ion implantation process is a vertical ion implantation process. In some embodiments, the ion implantation process is an angled ion implantation process. In some embodiments, the implantation process is followed by an annealing process. In some embodiments, doping the channel is accomplished in-situ, during a deposition step where bulk channel material is deposited onto a wafer surface prior to performing an etching process to shape the channel. In some embodiments, in-situ doping of a channel is performed during an epitaxial deposition process to form a fin of a FinFET or a nanowire of a NWEFET. In some embodiments, doping the channel is performed by depositing a layer of dopants and annealing the semiconductor structure to diffuse the dopants into substrate, fins, or nanowire structure.

A dopant concentration of the channel is less than a dopant concentration of the source and a dopant concentration of the drain. In some embodiments, a species implanted into the channel is the same as the species implanted into at least one of the source or the drain. In some embodiments, the species implanted into the channel is different from the species implanted into at least one of the source or the drain. According to some methods, the dopant added to a FET channel is an N-type dopant. Some methods include addition of a P-type dopant to the channel. Addition of the dopant to adjust or set the work function and threshold voltage of a FET sometimes involved creating a channel with a dopant concentration that is less than the concentration of a dopant in the source or drain of the corresponding FET. In some embodiments, operation 504 is performed to an N-type FET and a P-type FET in a sequential manner. In some embodiments, operation 504 is performed to both the N-type FET and the P-type FET in a simultaneously manner.

Method 500 includes an operation 506, wherein a gate dielectric layer is deposited on a substrate. In some embodiments, the gate dielectric layer is silicon dioxide ($SiO_2$) or silicon oxy nitride (SiON). Some embodiments have gate dielectric layers that are high-k dielectric materials such as HfZrO, $HfSiO_4$, $TiO_2$, $Ta_2O_3$, $ZrO_2$, $ZrSiO_2$, or combinations thereof, or other high-k dielectric materials. Deposition of the gate dielectric layer is sometimes accomplished by performing ALE or ALD. Deposition of gate dielectric layers by, for example, atomic layer deposition, covers not only the channel, but also the non-channel portion of a fin (for FinFETs) or wire (for NWFETS) as well as the transistor source and drain. In some embodiments, a gate dielectric layer is deposited before deposition of a bulk inter layer dielectric (ILD) layer that isolated FETs from each other. In some embodiments, a gate dielectric layer is deposited after ILD deposition.

Method 500 includes operation 508, wherein the source and the drain of the FET are doped with a dopant having the first dopant type. In some embodiments, doping the source and the drain includes an in-situ doping process during epitaxial growth of the source and the drain. In some embodiments, doping the source and the drain includes an implantation process. In some embodiments, the implantation process is followed by an annealing process. In some embodiments, the implantation is performed on the source in a sequential manner with the implantation process on the drain. In some embodiments, the implantation process is performed on the source and the drain simultaneously. In some embodiments, the implantation process on the source includes implanting a same dopant species as the implantation process on the drain. In some embodiments, the implantation process on the source implants a different dopant species from that implanted in the drain. In some embodiments, a dopant concentration of the source is equal to a dopant concentration of the drain. In some embodiments, the dopant concentration of the source is different from the dopant concentration of the drain. In some embodiments, the first dopant type is an N-type dopant, such as phosphorous, arsenic or another suitable n-type dopant. In some embodiments, the first dopant type is a P-type dopant, such as boron, indium or another suitable P-type dopant. Species suitable for the first dopant type depend on a material being doped. P-type dopants are electron acceptors. In contrast, N-type dopants are electron donors.

In some embodiments, operation 504 is performed simultaneously with either the implantation process on the source or the implantation process on the drain.

The source, drain, and channel extending between the source and drain are doped with a single dopant type to have a first concentration of dopant in each of the source, the drain, and the channel between the source and drain. According to some embodiments, once the source, drain, and channel have received the first dopant to a first concentration, a mask can be constructed over the channel between the source and drain to block the channel from receiving more dopant during a second doping process. According to some embodiments, the mask is a photoresist mask. In some embodiments, the mask comprises a dielectric material such as spin on glass that has been patterned with photoresist and etched in order to define a mask dimension over the channel corresponding to a channel length. Mask material, whether photoresist or dielectric mask material, is removed from the channel before the gate electrode is formed.

During the second doping process, the concentration of dopant in the source, drain, and channel (at least, a portion of channel outside of the mask area is) is increased to a second concentration greater than the first concentration of dopant in the channel. In some embodiments, the mask protecting the channel also covers one of the source or drain prior to the second doping process. In some embodiments, after the second doping process, the mask is removed and a second mask is applied to the wafer surface covering the channel and the other of the source or drain (exposed by the first mask) prior to a third doping process to adjust the dopant concentration in the exposed portion of the FET. In some embodiments, the second doping process involves a second dopant different from the first dopant and of the same type (N-type or P-type) as the first dopant. In some embodiments, the third doping process involves a third dopant different from the first dopant and the second dopant and of the same type as the first and second dopants.

Method 500 further includes operation 510 in which a work function layer is deposited over the channel. In some embodiments of an accumulation mode N-type transistor, a difference between an effective work function of the work function layer and a valence band energy of the substrate, e.g., the channel region, is equal to or smaller than 10% of the valence band energy. In some embodiments of an accumulation mode P-type transistor, a difference between an effective work function of the work function layer and a conduction band energy of the substrate, e.g., the channel region, is equal to or smaller than 10% of the conduction band energy. In some embodiments where the substrate includes a silicon-based material, work function layer is a P-type work function metal such as Pt, Ir, $RuO_2$, TiN, $MoN_x$, Ni, Pd, co, TaN, Ru, Mo, W or $WN_x$, or a silicide such as $ZrSi_2$, $MoSi_2$, $TaSi_2$, or $NiSi_2$, or other work function layers, or combinations thereof. In some embodiments, the work function layer is an N-type work function modifying metal such as Ti, Nb, Ag, Au, Al, Co, W, Ni, Ta, TaAl, TaAlC, TaAlN, TaC, TaCN, TaSiN, Mn, Zr, or other N-type work function layer, or combinations thereof. In some embodiments, one subset of FinFETs in an integrated circuit have a P-type work function layer and a second subset of FinFETs in the same integrated circuit have an N-type work function layer. In some embodiments, P-type work function layers are used in conjunction with high-k dielectric materials on P-type accumulation mode FinFETs. In some embodiments, N-type work function layers are used in conjunction with high-k dielectric materials on N-type accumulation mode FinFETs. In embodiments, the work function layer is deposited on the gate dielectric layer.

Method 500 includes operation 512 wherein a gate electrode material is deposited on the gate dielectric layer. According to some embodiments, the gate electrode material is polysilicon or silicon germanium. Some embodiments have gate electrodes made of other semiconductor materials such as type III-V semiconductors. According to some embodiments, gate electrodes may also include metallization layers or dopants configured to adjust the switching speed of transistors during operation of integrated circuits. In some embodiments, a gate electrode is formed from the gate electrode stack, including the gate electrode material, the gate dielectric layer, and, in some embodiments, a work function layer) by: depositing photoresist onto a layer of gate electrode material, patterning the photoresist to leave a mask line over a portion of the gate electrode material that is designated as the gate electrode, and etching the gate electrode stack to expose the source, the drain, and the non-channel portion of the fin (for FinFETs) or wire (for NWFETs). In some embodiments, etching the gate electrode is accomplished by performing a plasma etch to selectively remove films of the gate electrode stack from over the source, drain, and non-channel portions of fins (for FinFETs) or wires (for NWFETs).

In some embodiments, additional operations are added to method 500. For example, in some embodiments, fins for a FinFET are formed as part of method 500. As another example, in some embodiments, the source/drain regions are formed by an epitaxial growth process.

Figure 6A:
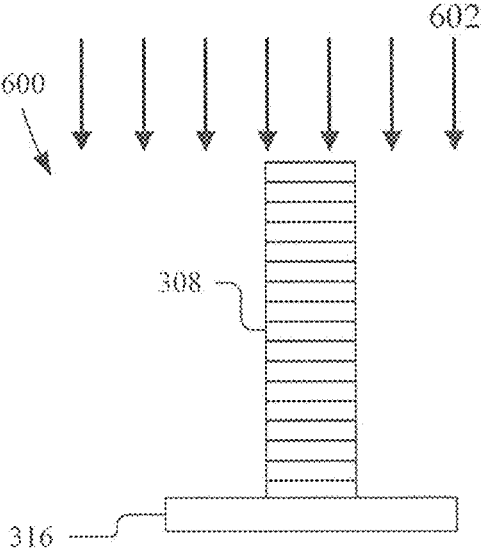
FIGS. 6A-6D are cross-sectional views of a FinFET during various stages of a manufacturing process, according to some embodiments.
Figure 6B:
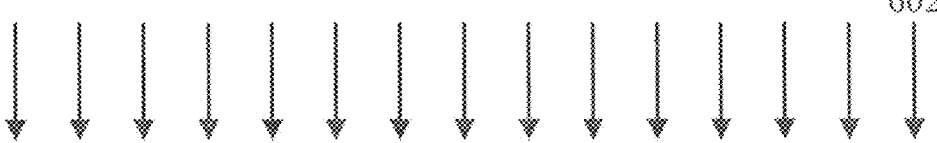
Figure 6B:
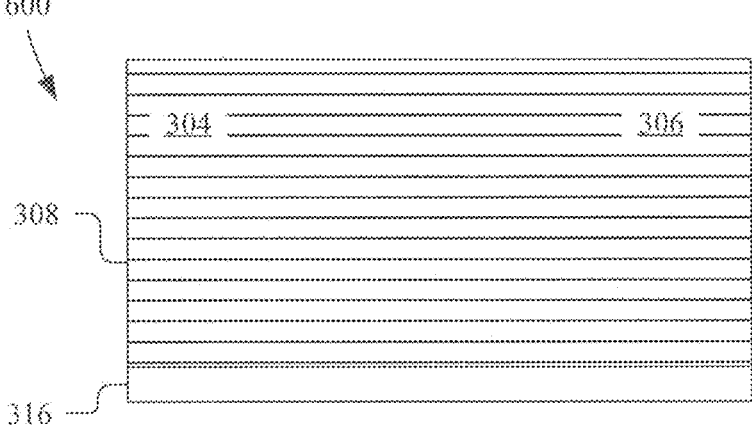

FIG. 6A is a cross-sectional view of FinFET 600 similar to accumulation mode FinFET 302 along cross-sectional line A-A during a manufacturing process, according to some embodiments. FIG. 6B is a cross-sectional view of FinFET 600 similar to accumulation mode FinFET 302 along cross-sectional line B-B at a same stage of a manufacturing process as FIG. 6A, according to some embodiments. FIGS. 6A and 6B show a substrate 316, from which fin 308 extends upward during a first doping step 602. First doping step 602 is adding a first dopant to a first concentration in each of source 304, drain 306, and fin 308. In some embodiments, source 304 and drain 306 are protected by a photoresist during step 602. A channel region is determined during step 602. First doping step 602 establishes a first concentration of dopants along the length of fin 308 consistent with a concentration of the dopant in the channel of the fact that is being formed.

Figures 6C, 6D:
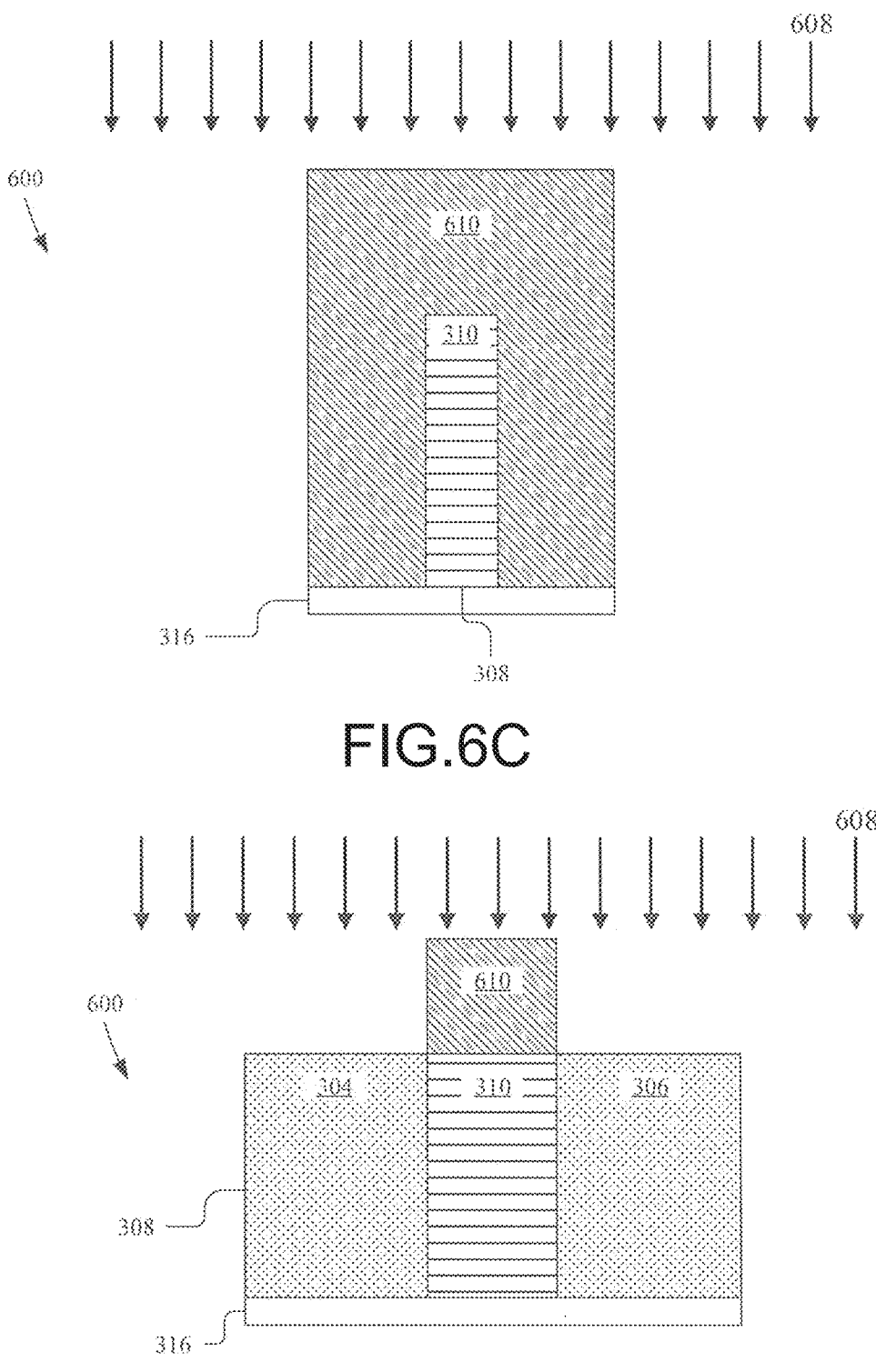

FIG. 6C is a cross-sectional view of FinFET 600 similar to accumulation mode FinFET 302 along cross-sectional line A-A during a manufacturing process after first doping step 602, described in FIG. 6A. Fin 308 in FinFET 600 have channel 310 at an upper portion of fin 308. Channel 310 is formed during second doping step 602, wherein the first dopant, added to a FinFET during a first doping step 602, is added to a source and drain of a FET. In some embodiments, channel 310 is protected by a mask 610. In some embodiments, mask 610 is a photoresist mask. In other embodiments, mask 610 is a composite mask layer, having an inorganic layer of mask material such as spin on glass or some other dielectric material covering channel 310 during second doping step 608.

FIG. 6D is a cross-sectional view of some embodiments of a FinFET 600 similar to accumulation mode FinFET 302 along cross-sectional line B-B during a manufacturing process after first doping step 602, described in FIG. 6B. FIGS. 6C and 6D represent a same stage in a manufacturing process. FIG. 6D shows a cross-sectional view of FinFET 600 along fin 308, showing source 304 and drain 306 connected by fin 308, with mask 610 above channel 310 protecting the channel from receiving further dopant during second doping step 608. Source 304, drain 306, and fin 308 are on substrate 316. In some embodiments of breakdown resistant FinFET 600, channel 310 is in an upper portion of the fin 308. Some embodiments of breakdown resistant FinFET 600 have channel 310 extending from the top of the fin 308 down to substrate 316.

Figure 7A:
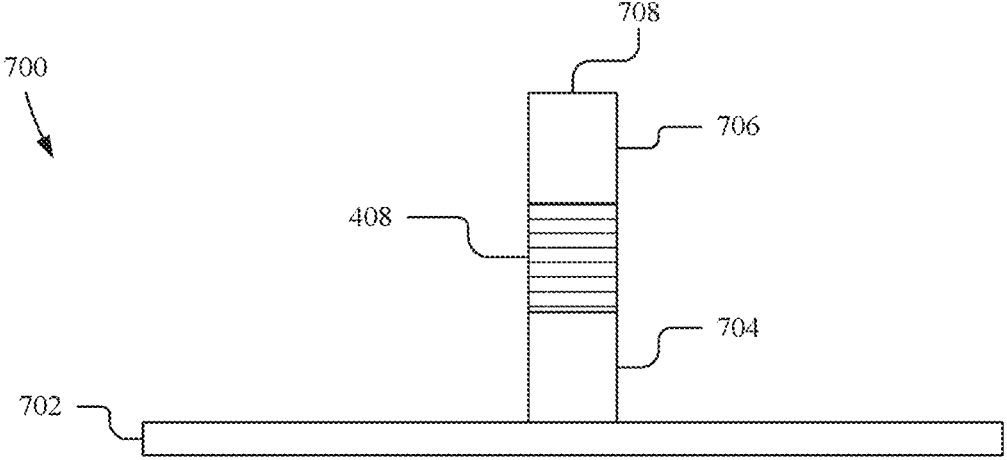
FIGS. 7A-7F are cross-sectional views of a NWFET during various stages of a manufacturing process, according to some embodiments.

FIG. 7A is a cross-sectional view of NWFET 700 similar to some embodiments of accumulation mode NWFET 402 along cross-sectional line D-D during a manufacturing process. Breakdown resistant FinFET 700 is on a substrate 702 and comprises source 404 and drain 406 interconnected by wire 408. Wire 408 is separated from substrate 702 by a sacrificial layer 704. In some embodiments, sacrificial layer 704 is a layer of dielectric material such as silicon dioxide. In some embodiments, sacrificial layer 704 is a layer of semiconductor material such as germanium. Sacrificial layer 704 is configured to be selectively removed from between wire 408 and substrate 702 by performing an etching process such as wet chemical etching. In some embodiments, sacrificial layer 706 is located on a top side of wire 408. According to some embodiments, sacrificial layer 706 is deposited onto a top side of wire 408 in order to allow chemical mechanical polishing or planarization of a wafer to establish a level top side 708 before being removed. In some methods of manufacturing accumulation mode NWFETs such as breakdown resistant NWFET 700, sacrificial layer 704 and sacrificial layer 706 are removed during a similar etching process.

Figure 7B:
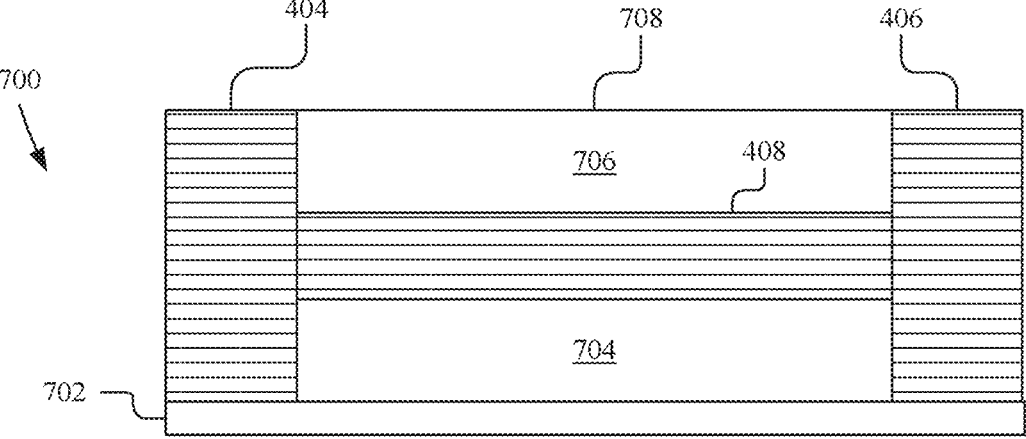

FIG. 7B is a cross-sectional view of NWFET 700 similar to some embodiments of accumulation mode NWFET 402 along cross-sectional line C-C during a manufacturing process at a same stage as shown in FIG. 7A. FinFET 700 comprises source 404 and drain 406 resting on substrate 702 and interconnected by wire 408. In some embodiments, sacrificial layers 704 and 706 establish the vertical thickness of wire 408 and the spacing of wire 408 above substrate 702. Sacrificial layers 704 and 706 can be removed during subsequent stages of manufacturing process using techniques such as wet chemical etching that are selective against removal of semiconductor material used to form source 404, drain 406, and wire 408.

Figure 7C:
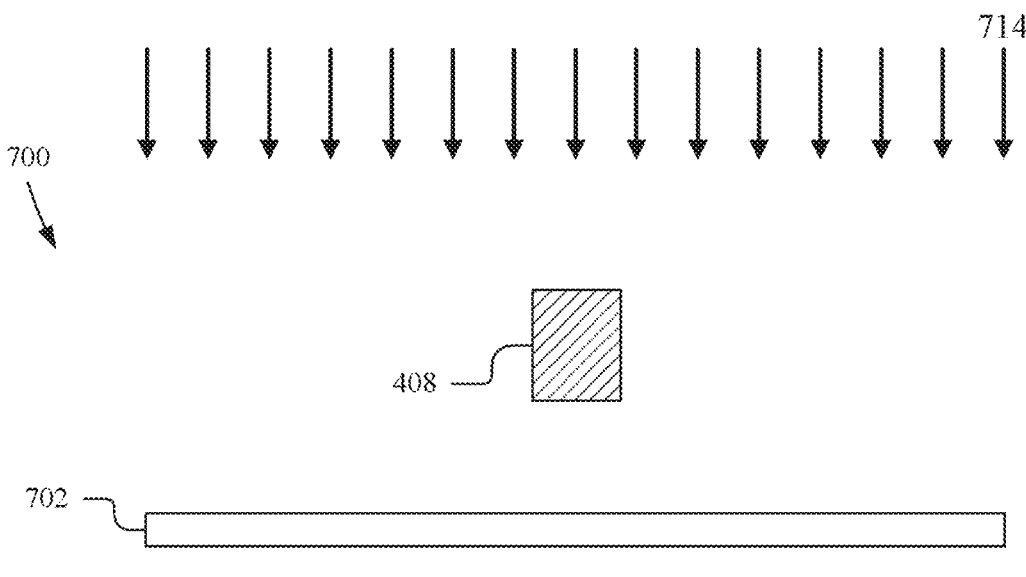

FIG. 7C is a cross-sectional view of NWFET 700 similar to some embodiments of accumulation mode NWFET 402, along cross-sectional line C-C, during a manufacturing process. NWFET 700 is portrayed during a first doping step 714, wherein a first dopant, either an N-type dopant or a P-type dopant, is being added to wire 408. According to some embodiments, sacrificial layer 704 has been removed prior to first doping step 714. In some embodiments, sacrificial layer 704 and sacrificial layer 706 remain present during first doping step 714.

Figure 7D:
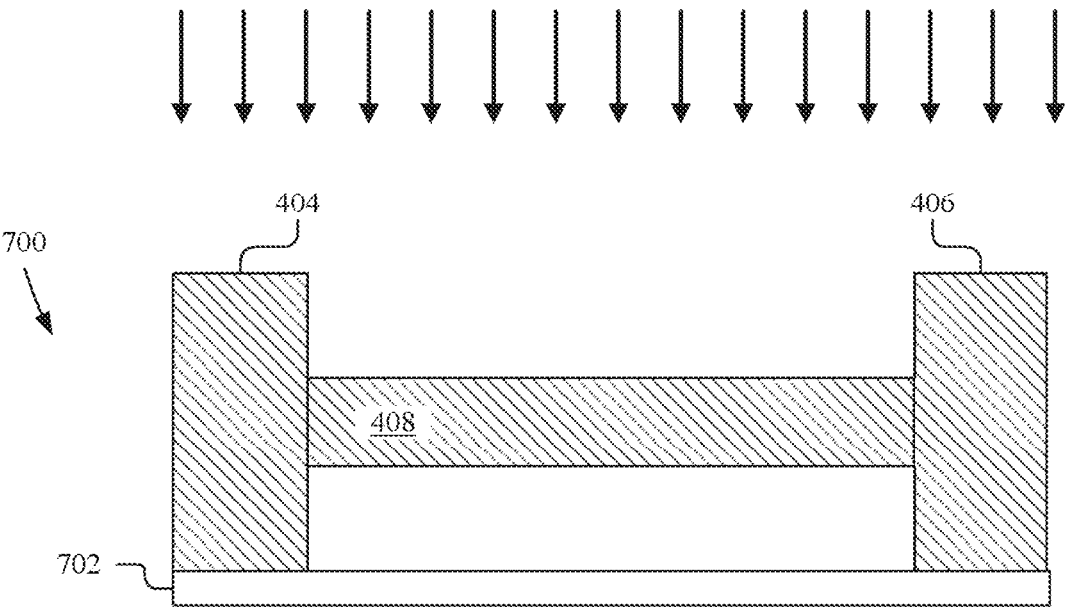

FIG. 7D is a cross-sectional view of NWFET 700 along cross-sectional line D-D during performance of a manufacturing process at a same stage as portrayed in FIG. 7C. Source 404 and drain 406, resting on substrate 702, are interconnected by wire 408 during the first doping step 714. Sacrificial layers 704 and 706 have been removed in the present cross-sectional view, although in certain embodiments, sacrificial layer 704 and 706 may be present during first doping step 714. According to certain versions of method 500, a work function of NWFET 700 is configured by doping wire 408 with a first concentration of a first dopant in first doping step 714. According to some embodiments, dopant can be added to wire 408 in more than one doping step prior to a masking the channel 410 of wire 408 to define the channel and add more dopant to source 404 and drain 406. Dopant can be added to wire 408, source 404, and drain 406 by one or multiple implanting processes.

Figure 7E:
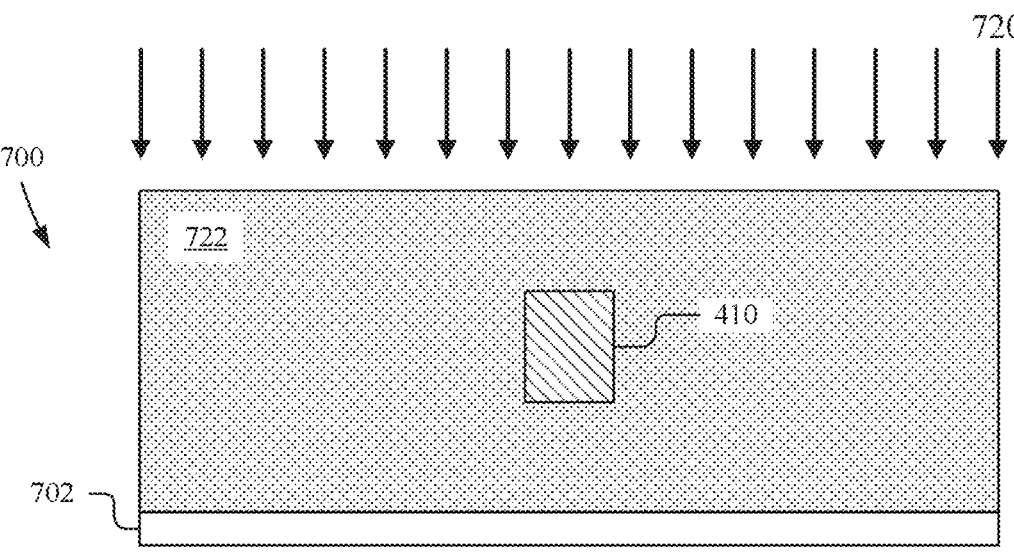

FIG. 7E is a cross-sectional view of some embodiments of NWFET 700, similar to a cross-sectional view of accumulation mode NWFET 402 along cross-sectional line C-C, during a manufacturing process. NWFET 700 is shown during a second doping step 720, wherein channel 410 is protected by mask 722 that encompasses channel 410 on all sides and rests on a top surface of substrate 702.

Figure 7F:
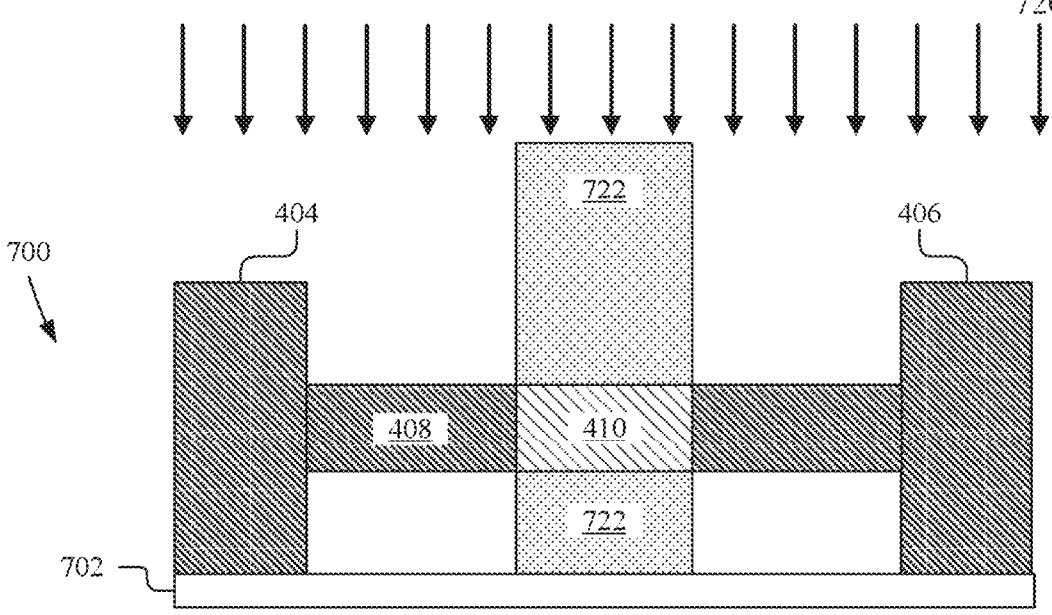

FIG. 7F is a cross-sectional view of embodiments of NWFET 700, similar to cross sectional views of accumulation mode NWFET 402 along cross-sectional line D-D, during second doping step 720. Source 404 and drain 406 resting on substrate 702 and are interconnected by wire 408. Wire 408 is partially masked by mask 722, which encompasses channel 410, protecting channel 410 from additional dopants being added to source 404, drain 406, and some portions of wire 408 by second doping process 720. Channel 410 and mask 722 are located at an interior portion of wire 428, separated from source 404 and drain 406. Mask 722 rests on a top surface of substrate 702. According to some embodiments, mask 722 is a photoresist layer that has been deposited and patterned. In some embodiments, mask 722 is a composite mask layer, comprising a bottom layer of dielectric material, such as a spin on glass, and a top layer of photoresist that has been patterned. In some embodiments, when mask 722 is a composite mask layer, the bottom layer of dielectric material has been partially removed, exposing source 404, drain 406, and some of wire 408, as well as a top surface of substrate 702. In some embodiments, the upper photoresist layer is removed, leaving only patterned dielectric material, before performing second doping step 720.

According to some embodiments of the present disclosure, FinFETs or NWFETS are field effect transistors with bilateral symmetry and operating voltages below 3 Volts. Bilateral symmetry is demonstrated along cross-sectional lines A-A and B-B for breakdown resistant FinFETs similar to accumulation mode FinFET 302 portrayed in FIGS. 3A and 3B. Bilateral symmetry is demonstrated along cross-sectional lines C-C and D-D for breakdown resistant NWFETS similar to accumulation mode NWFET 402 portrayed in FIGS. 4A and 4B. Operating voltages for breakdown resistant FETs described herein are consistent with planar CMOS NFET and PFET devices, and FinFET and NWFET devices.

An aspect of this description relates to a method of manufacturing a semiconductor device. The method includes implanting a channel region of a first transistor and a channel region of a second transistor to have a first conductivity type. The method further includes forming source/drain regions of the first transistor to have the first conductivity type and source/drain regions of the second transistor to have a second conductivity type, wherein the second conductivity is different from the first conductivity type. The method further includes depositing a first work function layer over the channel region of the first transistor. The method further includes depositing a second work function layer over the channel region of the second transistor, wherein the first work function layer includes a same material as the second work function layer. In some embodiments, the method further includes forming a lightly doped drain (LDD) region having the second conductivity type in the second transistor. In some embodiments, implanting the channel region of the first transistor and the channel region of the second transistor includes implanting the channel region of the first transistor and the channel region of the second transistor using a same dopant. In some embodiments, implanting the channel region of the first transistor and the channel region of the second transistor includes implanting the channel region of the first transistor and the channel region of the second transistor simultaneously. In some embodiments, implanting the channel region of the first transistor and the channel region of the second transistor includes using a p-type dopant. In some embodiments, implanting the channel region of the first transistor and the channel region of the second transistor includes using an n-type dopant. In some embodiments, implanting the channel region of the first transistor includes implanting the channel region of a metal-oxide-semiconductor (MOS) transistor. In some embodiments, implanting the channel region of the first transistor includes implanting the channel region of a fin field effect transistor (FinFET). In some embodiments, implanting the channel region of the first transistor includes implanting the channel region of a nanowire field effect transistor (NWFET).

An aspect of this description relates to a method of manufacturing a semiconductor device. The method includes doping a first channel region of a first transistor with a first dopant having a first conductivity type. The method further includes doping a second channel region of a second transistor with a second dopant having the first conductivity type. The method further includes forming first source/drain regions of the first transistor to have the first conductivity type. The method further includes forming second source/drain regions of the second transistor to have a second conductivity type, wherein the second conductivity is different from the first conductivity type. The method further includes forming a first gate electrode over the first channel region, wherein the first gate electrode comprises a first material. The method further includes forming a second gate electrode over the second channel region, wherein the second gate electrode comprises the first material. In some embodiments, doping the first channel region includes doping the first channel region with the first dopant being a same material as the second dopant. In some embodiments, forming the first source/drain regions includes in-situ doping the first source/drain regions during an epitaxial growth process. In some embodiments, forming the second source/drain regions includes performing an implantation process. In some embodiments, forming the first source/drain regions includes performing an implantation process. In some embodiments, doping the second channel region includes implanting the second channel region simultaneously with implanting the first channel region. In some embodiments, doping the first channel region includes doping the first channel region of a fin field effect transistor (FinFET). In some embodiments, doping the first channel region includes doping the first channel region of a nanowire field effect transistor (NWFET).

An aspect of this description relates to method of manufacturing a semiconductor device. The method includes doping a first channel region of a first transistor with a first dopant having a first conductivity type. The method further includes doping a second channel region of a second transistor with a second dopant having the first conductivity type. The method further includes growing first source/drain regions of the first transistor. The method further includes doping first source/drain regions to have the first conductivity type. The method further includes forming second source/drain regions of the second transistor to have a second conductivity type, wherein the second conductivity is different from the first conductivity type. The method further includes depositing a first work function layer over the first channel region. The method further includes depositing a second work function layer over the second channel region, wherein the first work function layer and the second work function layer comprise a same material. In some embodiments, doping the second channel region includes implanting the second channel region simultaneously with implanting the first channel region. In some embodiments, doping the first source/drain regions includes doping the first source/drain regions simultaneously with growing the first source/drain regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

implanting both an entirety of a channel region of a first transistor and an entirety of a channel region of a second transistor to have a first conductivity type;

forming source/drain regions of the first transistor to have the first conductivity type and source/drain regions of the second transistor to have a second conductivity type, wherein the second conductivity type is different from the first conductivity type, and the channel region of the first transistor is an entire area between the source/drain regions of the first transistor configured to permit current flow in response to a gate of the first transistor receiving a threshold voltage, wherein a depth of the channel region is equal to or greater than a depth of the source/drain regions;

forming a well having the second conductivity type, wherein the channel region is between a bottommost surface of the source/drain regions of the first transistor and the well;

depositing a first work function layer over the channel region of the first transistor; and depositing a second work function layer over the channel region of the second transistor, wherein the first work function layer includes a same material as the second work function layer.

2. The method of claim 1, further comprising:

forming a lightly doped drain (LDD) region having the second conductivity type in the second transistor.

3. The method of claim 1, wherein implanting the channel region of the first transistor and the channel region of the second transistor comprises:

implanting the channel region of the first transistor and the channel region of the second transistor using a same dopant.

4. The method of claim 1, wherein implanting the channel region of the first transistor and the channel region of the second transistor comprises:

implanting the channel region of the first transistor and the channel region of the second transistor simultaneously.

5. The method of claim 1, wherein implanting the channel region of the first transistor and the channel region of the second transistor comprises using a p-type dopant.

6. The method of claim 1, wherein implanting the channel region of the first transistor and the channel region of the second transistor comprises using an n-type dopant.

7. The method of claim 1, wherein implanting the channel region of the first transistor comprises implanting the channel region of a metal-oxide-semiconductor (MOS) transistor.

8. The method of claim 1, wherein implanting the channel region of the first transistor comprises implanting the channel region of a fin field effect transistor (FinFET).

9. The method of claim 1, wherein implanting the channel region of the first transistor comprises implanting the channel region of a nanowire field effect transistor (NWFET).

10. A method of manufacturing a semiconductor device, comprising:

doping an entirety of a first channel region of a first transistor with a first dopant having a first conductivity type, wherein doping the first channel region comprises doping the first channel region of a nanowire field effect transistor (NWFET);

doping an entirety of a second channel region of a second transistor with a second dopant having the first conductivity type;

forming first source/drain regions of the first transistor to have the first conductivity type, and the channel region of the first transistor is an entire area between the first source/drain regions configured to permit current flow in response to a gate of the first transistor receiving a threshold voltage, wherein a depth of the first channel region is equal to or greater than a depth of the first source/drain regions;

forming second source/drain regions of the second transistor to have a second conductivity type, wherein the second conductivity is different from the first conductivity type;

forming a well having the second conductivity type, wherein the first channel region is between a bottommost surface of the first source/drain regions and the well;

forming a first gate electrode over the first channel region, wherein the first gate electrode comprises a first material; and forming a second gate electrode over the second channel region, wherein the second gate electrode comprises the first material.

11. The method of claim 10, wherein doping the first channel region comprises doping the first channel region with the first dopant being a same material as the second dopant.

12. The method of claim 10, wherein forming the first source/drain regions comprises in-situ doping the first source/drain regions during an epitaxial growth process.

13. The method of claim 12, wherein forming the second source/drain regions comprises performing an implantation process.

14. The method of claim 10, wherein forming the first source/drain regions comprises performing an implantation process.

15. The method of claim 10, wherein doping the second channel region comprises implanting the second channel region simultaneously with implanting the first channel region.

16. A method of manufacturing a semiconductor device, comprising:

doping an entirety of a first channel region of a first transistor with a first dopant having a first conductivity type;

doping an entirety of a second channel region of a second transistor with a second dopant having the first conductivity type;

growing first source/drain regions of the first transistor, wherein the channel region of the first transistor is an entire area between the first source/drain regions configured to permit current flow in response to a gate of the first transistor receiving a threshold voltage, wherein a depth of the first channel region is equal to or greater than a depth of the first source/drain regions;

doping first source/drain regions to have the first conductivity type;

forming second source/drain regions of the second transistor to have a second conductivity type, wherein the second conductivity is different from the first conductivity type;

forming a well having the second conductivity type, wherein the first channel region is between a bottommost surface of the first source/drain regions and the well;

depositing a first work function layer over the first channel region; and depositing a second work function layer over the second channel region, wherein the first work function layer and the second work function layer comprise a same material.

17. The method of claim 16, wherein doping the second channel region comprises implanting the second channel region simultaneously with implanting the first channel region.

18. The method of claim 16, wherein doping the first source/drain regions comprises doping the first source/drain regions simultaneously with growing the first source/drain regions.

19. The method of claim 16, wherein doping the first channel region comprises doping the first channel region of a nanowire field effect transistor (NWFET).

20. The method of claim 16, wherein doping the first channel region comprises doping the first channel region with the first dopant being a same material as the second dopant.

* * * * *